United States Patent
Satoh

(10) Patent No.: US 9,602,052 B2
(45) Date of Patent: Mar. 21, 2017

(54) STABLE OSCILLATOR FOR USE IN AN ELECTRONIC CIRCUIT

(71) Applicant: KABUSHIKI KAISHA TOSHIBA, Tokyo (JP)

(72) Inventor: Yuji Satoh, Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 15/061,976

(22) Filed: Mar. 4, 2016

(65) Prior Publication Data

US 2017/0040944 A1    Feb. 9, 2017

(30) Foreign Application Priority Data

Aug. 7, 2015    (JP) .................. 2015-157289

(51) Int. Cl.
| | |
|---|---|
| H03K 3/26 | (2006.01) |
| H03B 5/24 | (2006.01) |
| H03B 1/04 | (2006.01) |
| H03B 1/00 | (2006.01) |
| G06F 1/04 | (2006.01) |
| H03K 4/502 | (2006.01) |
| H03B 5/12 | (2006.01) |
| H03L 7/18 | (2006.01) |

(52) U.S. Cl.
CPC .............. *H03B 5/24* (2013.01); *G06F 1/04* (2013.01); *H03B 1/00* (2013.01); *H03B 1/04* (2013.01); *H03B 5/1228* (2013.01); *H03K 3/26* (2013.01); *H03K 4/502* (2013.01); *H03L 7/18* (2013.01)

(58) Field of Classification Search
CPC .......... H03B 5/1228; H03B 1/00; H03K 3/26; H03K 4/502; H03L 7/18; G06F 1/04
USPC .................... 331/111, 143, 175, 57
See application file for complete search history.

(56) References Cited

U.S. PATENT DOCUMENTS

| | | | |
|---|---|---|---|
| 7,005,933 B1* | 2/2006 | Shutt ................. | G06F 1/04 331/111 |
| 8,212,624 B2* | 7/2012 | Tokunaga ........... | H03K 4/501 327/131 |

(Continued)

FOREIGN PATENT DOCUMENTS

| | | |
|---|---|---|
| JP | H01-157612 A | 6/1989 |
| JP | 11-57612 | 3/1999 |
| JP | 2013214915 A | 10/2013 |

*Primary Examiner* — Arnold Kinkead
(74) *Attorney, Agent, or Firm* — Patterson & Sheridan, LLP

(57) ABSTRACT

An oscillator includes first, second, and third current sources, a resistor having first and second terminals, first and second capacitors each having first and second terminals, a switch circuit through which each of the current sources is connectable to the first terminal of one of the resistor and the two capacitors to supply current thereto, a comparator, and switch controller configured to generate control signals for the switch circuit and an oscillation output signal for each of multiple periods based on an output signal from the comparator. During one of the periods, the switch circuit is controlled to connect the first current source to the first terminal of the first capacitor, the second current source to the first terminal of the resistor, the first terminal of the resistor to a first input of the comparator, and the first terminal of the first capacitor to a second input of the comparator.

20 Claims, 10 Drawing Sheets

(56) References Cited

U.S. PATENT DOCUMENTS

| | | | |
|---|---|---|---|
| 8,269,567 B2* | 9/2012 | Colin | H03B 5/20 331/111 |
| 2010/0283552 A1 | 11/2010 | Colin et al. | |
| 2013/0222069 A1 | 8/2013 | Paidimarri et al. | |

* cited by examiner

| PERIOD | T1a | T1b | T2a | T2b | T3a | T3b | T1a |
|---|---|---|---|---|---|---|---|
| INA(I1) | A(−) |  | B(+) | C(+) |  | B(−) | A(−) |
| INB(I2) | B(+) | C(+) |  | B(−) | A(−) |  | B(+) |
| INC(I3) |  | B(−) | A(−) |  | B(+) | C(+) |  |
| Sa | a | — | c | — | b | — | a |
| Sb | b | c | a | b | c | a | b |
| Sc | — | b | — | a | — | c | — |
| Sn1 | b | b | a | a | c | c | b |
| Sn2 | a | c | c | b | b | a | a |

| PERIOD | T1a | T1b | T2a | T2b | T3a | T3b | T1a |
|---|---|---|---|---|---|---|---|
| INA(I1) | A(−) | | B(+) | C(−) | | B(+) | A(−) |
| INB(I2) | B(+) | C(−) | | B(+) | A(−) | | B(+) |
| INC(I3) | | B(+) | A(−) | | B(+) | C(−) | |
| Sa | a | — | c | — | b | — | a |
| Sb | b | c | a | b | c | a | b |
| Sc | — | b | — | a | — | c | — |
| Sn1 | b | b | b | b | b | b | b |
| Sn2 | a | c | a | c | a | c | a |

STABLE OSCILLATOR FOR USE IN AN ELECTRONIC CIRCUIT

CROSS-REFERENCE TO RELATED APPLICATION

This application is based upon and claims the benefit of priority from Japanese Patent Application No. 2015-157289; filed Aug. 7, 2015, the entire contents of which are incorporated herein by reference.

FIELD

Embodiments described herein relate generally to an oscillator.

BACKGROUND

Flicker noise occurs in transistors that form a current source. The flicker noise is caused by defects in the transistors and the defects affect movement of electrons and holes so that the output of the current source becomes abnormal in a random manner. It is difficult to predict the fluctuations in the current source output caused by the flicker noise. In addition, the time necessary for a terminal voltage of a capacitor to reach a reference voltage fluctuates due to the flicker noise, and as a result, the oscillation frequency may fluctuate.

DETAILED DESCRIPTION

Embodiments provide an oscillator which can generate an oscillation output with a stable frequency irrespective of occurrence of flicker noise.

According to one embodiment, an oscillator includes first, second, and third current sources, a resistor having first and second terminals, the second terminal of the resistor being connected to a reference voltage, first and second capacitors each having first and second terminals, the second terminals of the first and second capacitors being connected to the reference voltage, a switch circuit through which each of the current sources is connectable to the first terminal of one of the resistor and the two capacitors to supply current thereto, a comparator having a first input, a second input, and configured to generate an output signal by comparing voltage levels at the first input and the second input, and a switch controller configured to generate control signals for the switch circuit and an oscillation output signal for each of multiple periods based on the output signal from the comparator. During a first period, which is one of the periods, the switch circuit is controlled to connect the first current source to the first terminal of the first capacitor, the second current source to the first terminal of the resistor, the first terminal of the resistor to the first input of the comparator, and the first terminal of the first capacitor to the second input of the comparator.

Hereinafter, embodiments are described in detail with reference to the drawings.

First Embodiment

Figure 1:
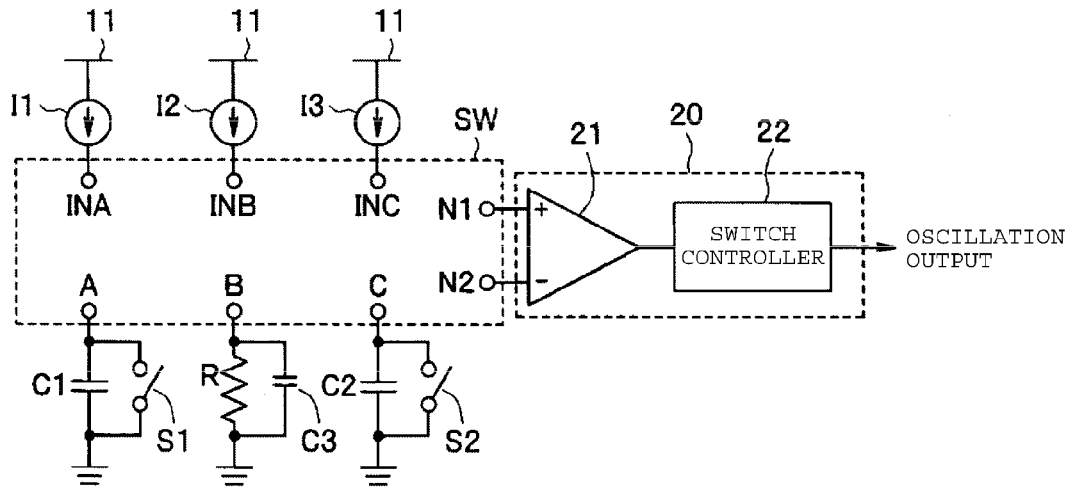
FIG. 1 is a circuit diagram illustrating an oscillator according to a first embodiment.
Figure 2:
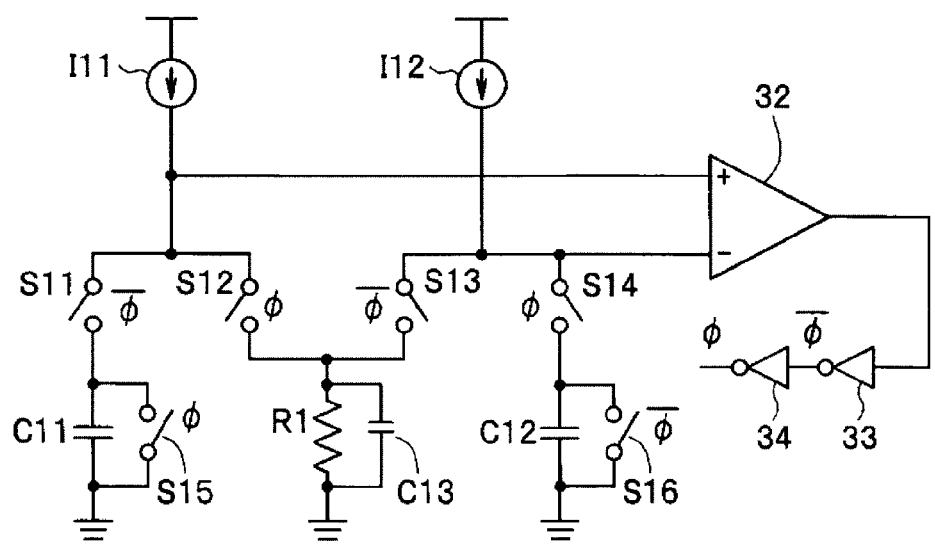
FIG. 2 is a circuit diagram illustrating an oscillator of the related art.

FIG. 1 is a circuit diagram illustrating an oscillator according to the first embodiment. In addition, FIG. 2 is a circuit diagram illustrating an oscillator of the related art and illustrates a circuit disclosed in US-A-2013/0222069.

First, the oscillator of the related art is described with reference to FIG. 2. In FIG. 2, switches S11, S13, and S16 are simultaneously turned on in response to a high level (hereinafter, referred to as H level) of a control signal φ bar (hereinafter, referred to as /φ) that is a reverse signal of a control signal φ, and are simultaneously turned off in response to a low level (hereinafter, referred to as L level) of the control signal /φ). Switches S12, S14, and S15 are simultaneously turned on in response to the H level of the control signal φ and are simultaneously turned off in response to the L level of the control signal φ.

If the switches S11 and S13 are turned on, a current from a current source I11 flows through a capacitor C11 via the switch S11 and a terminal voltage of the capacitor C11 is increased. Then, a voltage applied to a positive-phase input terminal of a comparator 32 is increased. In addition, a current from a current source I12 flows through a resistor R1 via the switch S13. A predetermined constant voltage (reference voltage) is applied to a reverse-phase input terminal of the comparator 32 as a result of a voltage drop across the resistor R1. The comparator 32 changes an output from the L level to the H level if a terminal voltage of the capacitor C11 is higher than the reference voltage based on a resistance value of the resistor R1.

When the control signal /φ becomes the L level, and the control signal φ becomes the H level, then, the switches S11, S13, and S16 are turned off, the switches S12, S14, and S15 are turned on, and the capacitor C12 is charged by a current from the current source I12 via the switch S14. In addition, the current from the current source I11 flows through the resistor R1, and a voltage drop is generated.

The terminal voltage of the capacitor C12 is supplied to the reverse-phase input terminal of the comparator 32, and the reference voltage based on the resistance value of the resistor R1 is supplied to the positive-phase input terminal of the comparator 32. If the terminal voltage of the capacitor C12 exceeds the reference voltage based on the resistance value of the resistor R1, the output of the comparator 32 is reversed from the H level to the L level. When the control signal /φ becomes the H level and the control signal φ becomes the L level, then switches S11, S13, and S16 are turned on, the switches S12, S14, and S15 are turned off, and then the same operation is repeated.

The output of the comparator 32 is reversed whenever the terminal voltage of the capacitor C11 reaches the reference voltage or the terminal voltage of the capacitor C12 reaches the reference voltage. That is, a change in the terminal voltage based on the constant current values of the current sources I11 and I12 and capacitances of the capacitors C11 and C12, and an oscillation output of a constant cycle according to the reference voltage based on the resistance value of the resistor R1 are obtained from the comparator 32. The output of the comparator 32 is supplied to comparators 33 and 34, and the control signals /φ and φ are generated whenever the output of the comparator 32 is reversed.

If offset is generated in the comparator 32, a reverse timing of the output of the comparator 32 is changed due to influence of offset. Accordingly, if the reference voltage is supplied only to the reverse-phase input terminal of the comparator 32, the oscillation frequency is changed for respective elements due to a difference in an offset value. To the contrary, the circuit of FIG. 2 switches an input terminal of the comparator 32 to which the reference voltage is applied whenever the output of the comparator 32 is reversed. Thus, the influence of the offset is cancelled when the output of the comparator 32 is the H level and the L level, and it is possible to make the oscillation frequency constant irrespective of the difference in the offset value.

However, as described above, the current amounts of the current sources I11 and I12 may fluctuate due to the flicker noise, the occurrence of which is difficult to predict. In an oscillator of this type using the current sources, there is a defect that the oscillation frequency is varied due to the fluctuation.

In the embodiment, the variation of the oscillation frequency is suppressed by using three or more current sources and by suppressing occurrence of the flicker noise.

In FIG. 1, current sources I1 to I3 are respectively connected to the power supplies 11 and each of the current sources I1 to I3 generates a predetermined constant current. In the embodiment, the each of current sources I1 to I3 may generate the same constant current. The current sources I1 to I3 respectively can supply the generated constant current to terminals INA to INC (first, second and third input terminals) of a switch circuit SW. A terminal A (first capacitor terminal) of the switch circuit SW is connected to a reference potential point via a capacitor C1. In addition, a terminal B (resistor terminal) of the switch circuit SW is connected to a reference potential point via a resistor R and a terminal C (second capacitor terminal) of the switch circuit SW is connected to a reference potential point via a capacitor C2. In the embodiment, the each of the capacitors C1 and C2 may have the same capacitance value. Switches S1 and S2 are also connected respectively between the terminals A and C, and the reference potential points. In addition, a capacitor C3 for preventing chattering is connected between the terminal B and the reference potential point. In some cases, the capacitor C3 may be omitted.

Terminals N1 (first comparator terminal and N2 (second comparator terminal) of the switch circuit SW are connected to a positive-phase input terminal and a reverse-phase input terminal of a comparator 21. An output terminal of the comparator 21 is connected to a switch controller 22. The comparator 21 compares voltages applied to the positive-phase input terminal and the reverse-phase input terminal, and outputs a comparison result from the output terminal to the switch controller 22.

In the embodiment, the resistor R is used for generating a reference voltage applied to the positive-phase input terminal or the reverse-phase input terminal of the comparator 21. As described below, constant currents I1 to I3 from the current sources I1 to I3 flow through the resistor R, and a voltage is generated based on a voltage drop. The voltage is supplied to the terminal N1 or N2 as the reference voltage.

On the other hand, the capacitors C1 and C2 generate a voltage to determine timing for reversing an output of the comparator 21. As described below, terminal voltages of the capacitors C1 and C2 are changed by the constant currents I1 to I3 supplied from the current sources I1 to I3. The terminal voltages of the capacitors C1 and C2 are applied to the positive-phase input terminal or the reverse-phase input terminal of the comparator 21 via the terminal N1 or N2.

When the terminal voltage of the capacitors C1 or C2 exceeds the reference voltage based on the resistor R, the output of the comparator 21 is reversed. The terminal voltages of the capacitors C1 and C2 are changed according to the constant currents I1 to I3 from the current sources I1 to I3, and a reverse cycle of the output of the comparator 21 is based on the constant currents I1 to I3, capacitance values of the capacitors C1 and C2, and a resistance value R of the resistor R. Then, it is possible to generate a rectangular wave of a predetermined cycle from the output terminal of the comparator 21.

The output of the comparator 21 is applied to the switch controller 22. The switch controller 22 is, for example, a CMOS (complementary metal-oxide semiconductor) switch, which outputs an oscillation output based on the output of the comparator 21. Alternatively, a signal appearing at the output terminal of the comparator 21 may be used as the oscillation output. The switch controller 22 generates control signals for controlling the switch circuit SW and the switches S1 and S2 based on the output from the comparator 21.

In the embodiment, the switch circuit SW can switch and connect the terminal INA to one of the terminals A to C. In addition, the switch circuit SW can switch and connect the terminal INB to one of the terminals A to C and may also switch and connect the terminal INC to one of the terminals A to C.

Furthermore, the switch circuit SW connects the terminal INA to one of the terminals A to C, and simultaneously can connect the terminal INA to the terminal N1 or N2. In addition, the switch circuit SW connects the terminal INB to one of the terminals A to C, and simultaneously can connect the terminal INB to the terminal N1 or N2, and connects the terminal INC to one of the terminals A to C, and simultaneously can connect the terminal INC to the terminal N1 or N2.

The switch circuit SW is configured such that a connection destination of each terminal is set by the switch controller 22. The output of the comparator 21 is applied to the switch controller 22 and the switch controller 22 switches the connection of each terminal of the switch circuit SW whenever the output of the comparator 21 is switched to the L level and the H level.

In the embodiment, the switch controller 22 supplies the constant current to the terminal B, and one of the terminals A and C by using only two current sources of the current sources I1 to I3, and switches the in-use current source by changing the connection destination of each terminal of the switch circuit SW. For example, the switch controller 22 may change sequentially the current source that is not used whenever the output of the comparator 21 is reversed. That is, in this case, each of the current sources I1 to I3 has a period for which each of the current sources I1 to I3 is not used every third half cycle of the output (oscillation output) of the comparator 21 and is continuously used only in 2 half cycles of the oscillation output.

The switch controller 22 controls the switch circuit SW such that any the constant currents I1 to I3 of the current sources I1 to I3 is always supplied to the terminal B and controls the switch circuit SW such that the terminal B is alternately connected to the terminals N1 and N2 every half cycle of the oscillation output. In addition, the switch controller 22 controls the switch circuit SW such that the constant current of the constant currents I1 to I3, which is not supplied to the terminal B, is alternately supplied to the terminal A or the terminal C every half cycle of the oscillation output, and controls the switch circuit SW such that the terminal A or the terminal C to which the constant current is supplied is alternately connected to the terminals N1 and N2, that are not connected to the terminal B, every half cycle of the oscillation output. In addition, the switch controller 22 controls the switch circuit SW such that the switches S1 and S2 are turned on and charged electric charges of the capacitors C1 and C2 are discharged in a period in which the capacitors C1 and C2 are not charged by the constant current.

Figure 3:
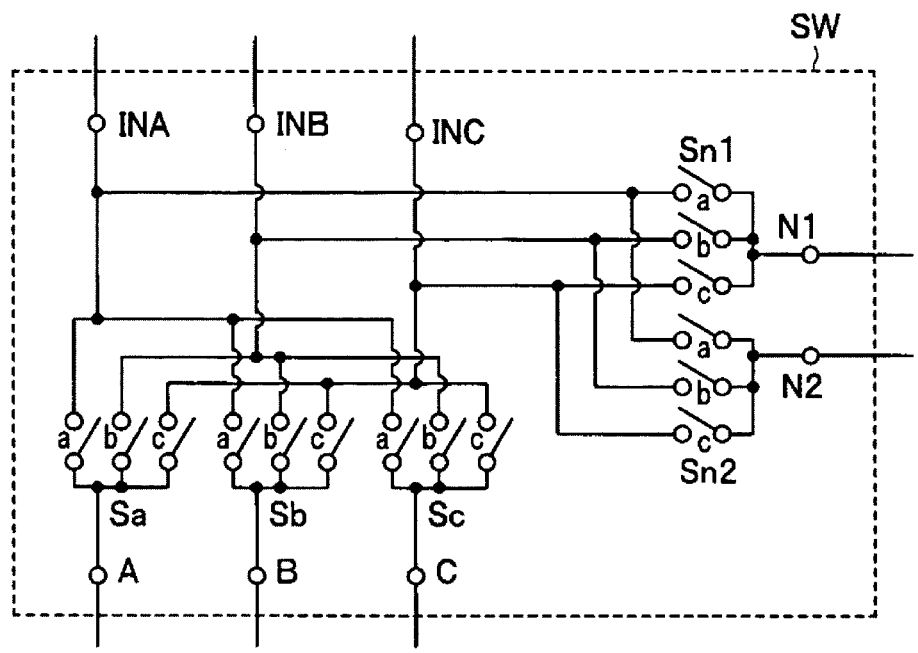
FIG. 3 is a circuit diagram illustrating an example of a specific circuit configuration of the switch circuit in FIG. 1.

FIG. 3 is a circuit diagram illustrating an example of a specific circuit configuration of the switch circuit SW in FIG. 1. The switch circuit SW includes five switch groups Sa, Sb, Sc, Sn1, and Sn2 respectively including three switches a, b, and c. That is, each switch group is a single pole, three throw (SP3T) switch. In each of the switches a to c of the switch groups Sa, Sb, Sc, Sn1, and Sn2, one end (the single pole) is commonly connected for each of the switch groups Sa to Sc, Sn1, and Sn2, and is connected to each of the terminals A to C, N1, and N2. In addition, the other ends of switches a (the a-throws) of the switch groups Sa, Sb, Sc, Sn1, and Sn2 are all connected to the terminal INA. Similarly, the other ends of switches b (the b-throws) of the switch groups Sa, Sb, Sc, Sn1, and Sn2 are all connected to the terminal INB, and the other ends of switches c (the c-throws) of the switch groups Sa, Sb, Sc, Sn1, and Sn2 are all connected to the terminal INC.

Figure 4:
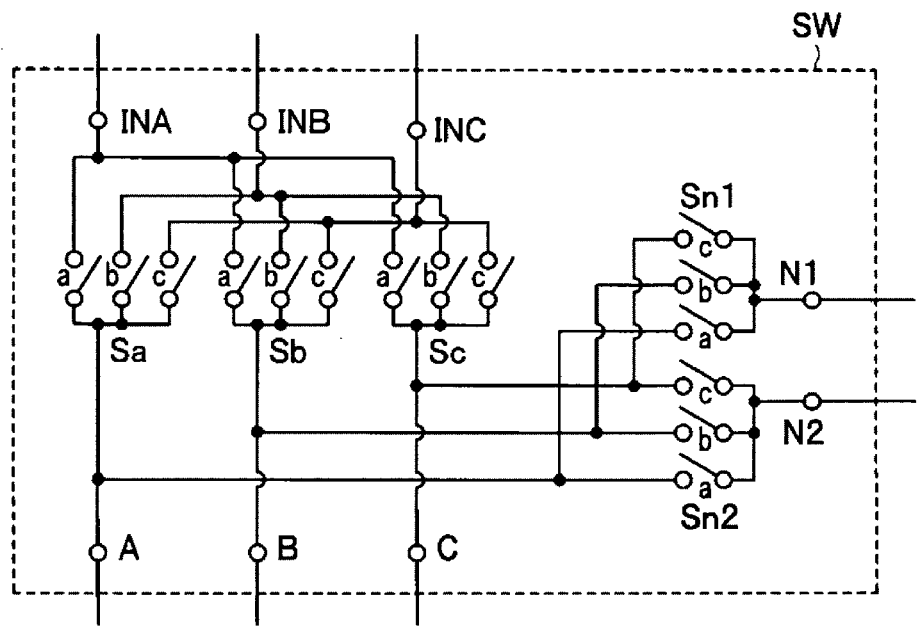
FIG. 4 is a circuit diagram illustrating another circuit example of the switch circuit in FIG. 1.

FIG. 4 is a circuit diagram illustrating another circuit example of the switch circuit SW in FIG. 1. Also in the example of FIG. 4, five switch groups Sa, Sb, Sc, Sn1, and Sn2 including three switches a, b, and c are used, each switch group being a SP3T switch. Each of the switches a, b, and c of the switch groups Sa, Sb, Sc, Sn1, and Sn2 is commonly connected for each of the switch groups Sa to Sc, Sn1, and Sn2, and is connected to each of the terminals A to C, N1, and N2. That is, the pole of each switch group is connected to the terminals A to C, N1 and N2. In addition, the other ends of switches a (the a-throws) of the switch groups Sa, Sb, and Sc are all connected to the terminal INA, the other ends of switches b (the b-throws) are all connected to the terminal INB, and the other ends of switches c (the c-throws) are all connected to the terminal INC. In addition, other ends of the switches a (the a-throws) of the switch groups Sn1 and Sn2 are all connected to the common terminal (the pole) of the switch group Sa, and the other ends of the switches b (b-throws) are all connected to the common terminal (the pole) of the switch group Sb, and the other ends of the switches c (the c-throws) are all connected to the common terminal (pole) the switch group Sc.

The switch controller 22 can turn on one of the switches a to c by controlling the switch groups Sa, Sb, Sc, Sn1, and Sn2 of FIGS. 3 and 4. Thus, the above-described control for connecting between the terminals INA to INC, the terminals A to C, and the terminals N1 and N2 is performed.

Moreover, the configurations of FIGS. 3 and 4 are an example and any circuit configuration may be employed as long as the connection control between the terminals described above can be performed.

Figure 5:
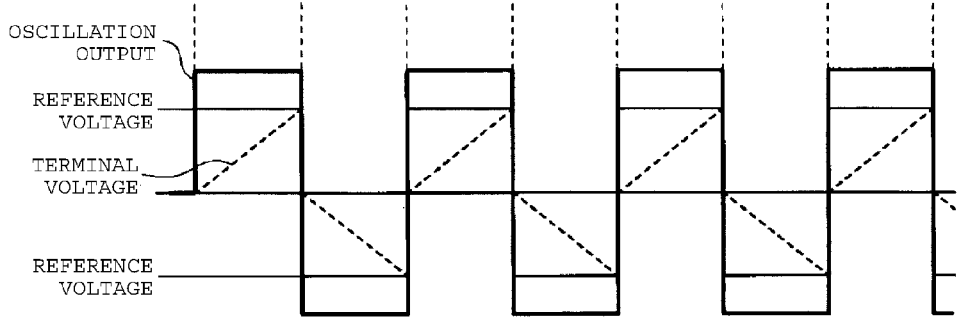
FIG. 5 illustrates control of constant current supply to the terminals using the switch circuit of FIG. 1.

Next, an operation of the embodiment having such a configuration is described with reference to FIGS. 5 to 11. FIG. 5 is an explanatory view illustrating how the constant current is supplied to a particular terminal by control of the switch circuit SW, the oscillation output, and the switch circuit SW. In addition, FIGS. 6 to 11 are circuit diagrams illustrating wiring states in each period of FIG. 5. In FIGS. 6 to 11, a solid line in the switch circuit SW indicates wiring connected to the terminal B, that is, wiring for supplying the reference voltage to the comparator 21, and a broken line indicates wiring connected to the terminal A or C, that is, wiring for supplying the terminal voltage of the capacitor to the comparator 21.

The switch controller 22 performs control, for example, illustrated in FIG. 5 with respect to the switch circuit SW. FIG. 5 illustrates control in each period corresponding to a half cycle of the oscillation output and illustrates that the same control is performed every three cycles of the oscillation output. Moreover, in FIG. 5, a subscript (+) indicates that a terminal to which the subscript is added is connected to the terminal N1 and a subscript (−) indicates that a terminal to which the subscript is added is connected to the terminal N2.

For example, it is indicated that the switch controller 22 allows the terminal INA to be connected to the terminal A and the terminal N2, and the terminal INB to be connected to the terminal B and the terminal N1 in a period T1a which is a first half cycle of the three cycles. For example, if the switch circuit SW is configured with the circuit of FIG. 3, the switch controller 22 allows the switches a of the switch groups Sa and Sn2, and the switches b of the switch groups Sb and Sn1 to be turned on, and all switches a to c of the switch group Sc to be turned off. Moreover, control of the switch groups Sa to Sc, Sn1, and Sn2 illustrated in FIG. 5 corresponds to the circuit of FIG. 3, but the same control can be performed even if the circuit of FIG. 4 is used. Thus, description of the control using the circuit of FIG. 4 is omitted.

As illustrated in FIG. 5, it is understood that when one terminal of the terminals INA to INC is not connected to another terminal, the current from one the current source of three current sources I1 to I3 is not used. In addition, as indicated in the symbols + and − of FIG. 5, it is understood that the terminal B connected to the resistor R is alternately connected to the terminal N1 and the terminal N2 every half cycle, the reference voltage obtained by a resistor B is alternately supplied to the positive-phase input terminal and the reverse-phase input terminal of the comparator 21, and then the influence of offset is removed.

Moreover, the switch controller 22 allows a switch of the switches S1 and S2, which is connected to the capacitors C1 and C2 in parallel in a period in which the current is not supplied via the terminals INA to INC, to be turned on in the period and accumulated charge to be discharged. For example, since the current is not supplied to the terminal A in a period T1b of FIG. 5, the switch controller 22 performs control such that the switch S1 connected to the capacitor C1 is turned on and, for example, since the current is not supplied to the terminal C in a period T2a, the switch S2 connected to the capacitor C2 is turned on.

Operation of Each Period

In the initial period T1a of the three cycles, the switch controller 22 allows the terminal INA to be connected to the terminal A and the terminal N2, and the terminal INB to be connected to the terminal B and the terminal N1. For example, if the switch circuit SW is configured with the circuit of FIG. 3, the switch controller 22 allows the switches a of the switch groups Sa and Sn2, and the switches b of the switch groups Sb and Sn1 to be turned on, and all switches a to c of the switch group Sc to be turned off.

Figure 6:
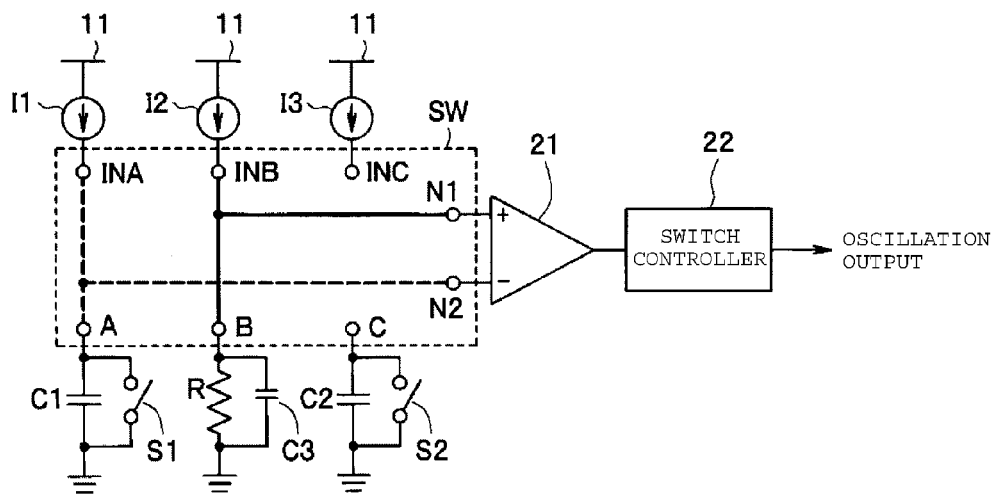
FIGS. 6-11 are each a circuit diagram illustrating a different wiring state of the oscillator according to the first embodiment.

FIG. 6 illustrates this state and the current I1 from the current source I1 is supplied to the capacitor C1 and the current I2 from the current source I2 flows through the reference potential point via the resistor R. That is, the current does not flow from the current source I3 in the period T1a. The reference voltage based on the current I2 and the resistor R is applied to the positive-phase input terminal of the comparator 21 via the terminal N1. On the other hand, the capacitor C1 is charged by the current I1 and the terminal voltage of the capacitor C1 is accordingly increased. If the terminal voltage of the capacitor C1 exceeds the reference voltage based on the resistor R, the output of the comparator 21 is reversed. Thus, the switch controller 22 completes the period T1a and performs the control of the next period T1b. Thus, during the T1a time period, the switch circuit is configured to connect INA and INB respectively to C1 and R and respectively to N2 and N1, while S2 discharges C2.

In the period T1b, the switch controller 22 allows the terminal INB to be connected to the terminal C and the terminal N1, and the terminal INC to be connected to the terminal B and the terminal N2. For example, if the switch circuit SW is configured with the circuit of FIG. 3, the switch controller 22 allows the switches b of the switch groups Sc and Sn1, and the switches c of the switch groups Sb and Sn2 to be turned on, and all switches a to c of the switch group Sa to be turned off. Thus, during the T1b time period, the switch circuit is configured to respectively connect INC and INB to R and C2 and respectively to N2 and N1, while S1 discharges C1.

Figure 7:
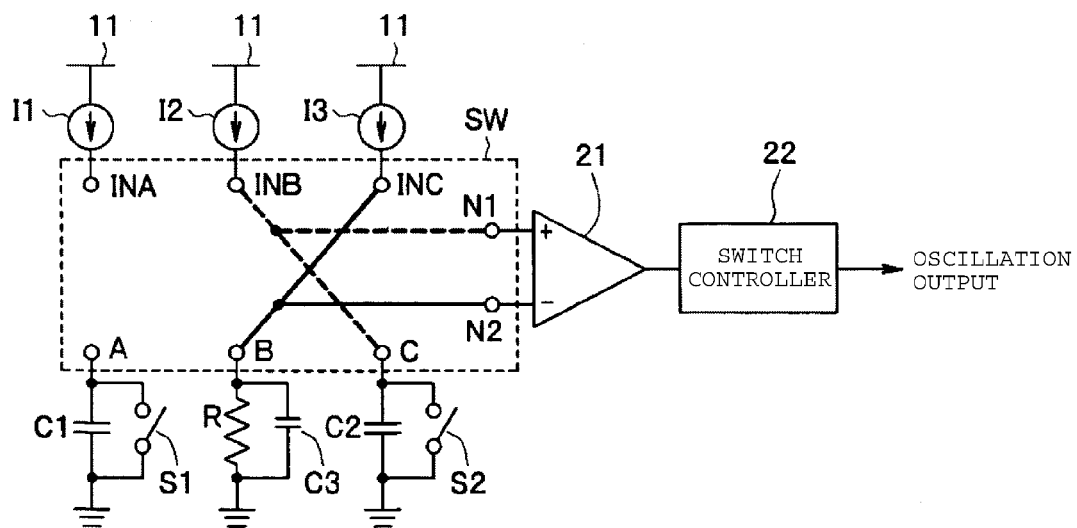

FIG. 7 illustrates this state and the current I2 from the current source I2 is supplied to the capacitor C2 and the current I3 from the current source I3 flows through the reference potential point via the resistor R. That is, the current does not flow from the current source I1 in the period T1b. The reference voltage based on the current I3 and the resistor R is applied to the reverse-phase input terminal of the comparator 21 via the terminal N2. On the other hand, the capacitor C2 is charged by the current I2 and the terminal voltage of the capacitor C2 is accordingly increased. If the terminal voltage of the capacitor C2 exceeds the reference voltage based on the resistor R, the output of the comparator 21 is reversed. Thus, the switch controller 22 completes the period T1b and performs the control of the next period T2a. Moreover, in the period T1b, the switch S1 is turned on and the capacitor C1 is discharged.

In the next period T2a, the switch controller 22 allows the terminal INA to be connected to the terminal B and the terminal N1, and the terminal INC to be connected to the terminal A and the terminal N2. For example, if the switch circuit SW is configured with the circuit of FIG. 3, the switch controller 22 allows the switches c of the switch groups Sa and Sn2, and the switches a of the switch groups Sb and Sn1 to be turned on, and all switches a to c of the switch group Sc to be turned off. Thus, during the T2a time period, the switch circuit is configured to respectively connect INC and INA to C1 and R and respectively to N2 and N1, while S2 discharges C2.

Figure 8:
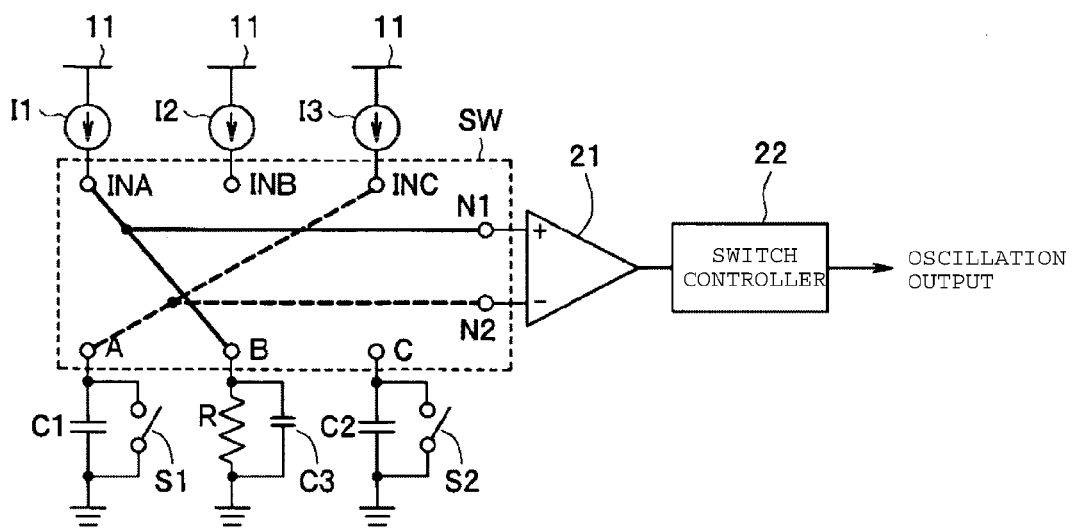

FIG. 8 illustrates this state and the current I3 from the current source I3 is supplied to the capacitor C1 and the current I1 from the current source I1 flows through the reference potential point via the resistor R. That is, the current does not flow from the current source I2 in the period T2a. The reference voltage based on the current I1 and the resistor R is applied to the positive-phase input terminal of the comparator 21 via the terminal N1. On the other hand, the capacitor C1 is charged by the current I3 and the terminal voltage of the capacitor C1 is accordingly increased. If the terminal voltage of the capacitor C1 exceeds the reference voltage based on the resistor R, the output of the comparator 21 is reversed. Thus, the switch controller 22 completes the period T2a and performs the control of the next period T2b. Moreover, in the period T2a, the switch S2 is turned on and the capacitor C2 is discharged.

Figure 9:
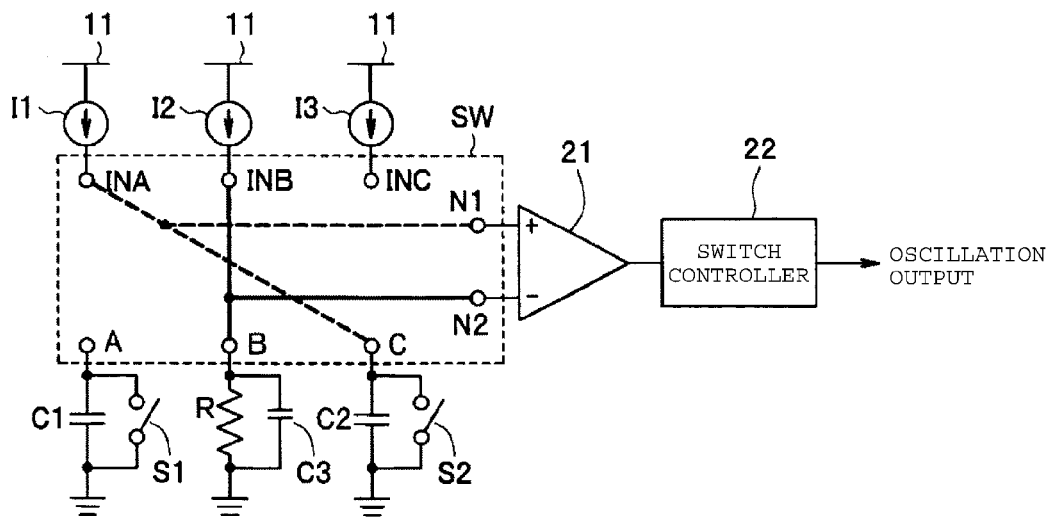

Thereafter, the same operation is repeated. That is, in the period T2b, as illustrated in FIGS. 5 and 9, the switch controller 22 allows the terminal INA to be connected to the terminal C and the terminal N1, and the terminal INB to be connected to the terminal B and the terminal N2. For example, if the switch circuit SW is configured with the circuit of FIG. 3, the switch controller 22 allows the switches b of the switch groups Sb and Sn2, and the switches a of the switch group Sc and Sn1 to be turned on, and all the switches a to c of the switch group Sa to be turned off. That is, the current does not flow from the current source I3 in the period T2b. The terminal voltage of the capacitor C2 is accordingly increased and if the terminal voltage of the capacitor C2 exceeds the reference voltage based on the resistor R, the output of the comparator 21 is reversed. Thus, the switch controller 22 completes the period T2b and performs the control of the next period T3a. Moreover, in the period T2b, the switch S1 is turned on and the capacitor C1 is discharged. Thus, during time period T2b, the switch circuit is configured to respectively connect INB and INA to R and C2 and respectively to N2 and N1, while S1 discharges C1.

Figure 10:
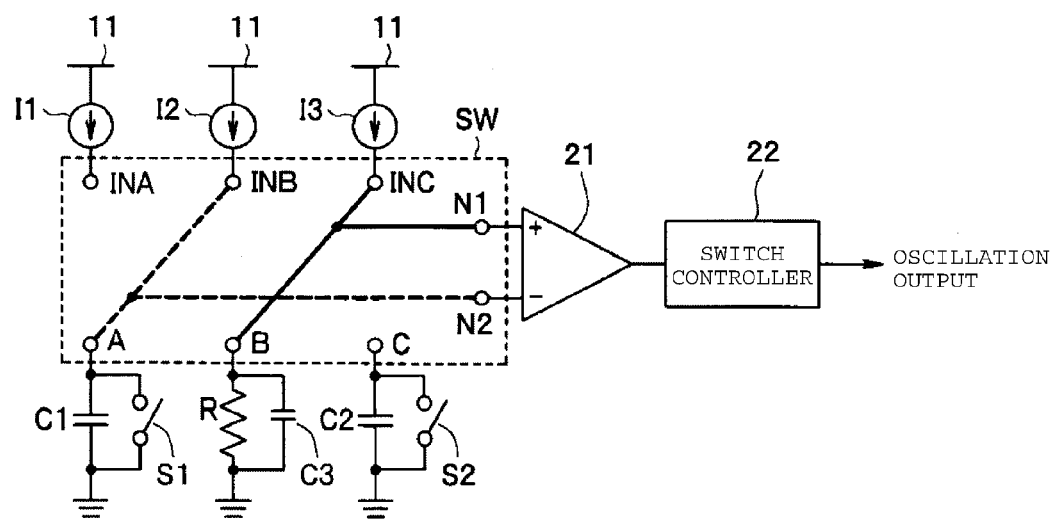

In the next period T3a, as illustrated in FIGS. 5 and 10, the switch controller 22 allows the terminal INB to be connected to the terminal A and the terminal N2, and the terminal INC to be connected to the terminal B and the terminal N1. For example, if the switch circuit SW is configured with the circuit of FIG. 3, the switch controller 22 allows the switches b of the switch groups Sa and Sn2, and the switches c of the switch groups Sb and Sn1 to be turned on, and all switches a to c of the switch group Sc to be turned off. That is, the current does not flow from the current source I1 in the period T3a. The terminal voltage of the capacitor C1 is accordingly increased and if the terminal voltage of the capacitor C1 exceeds the reference voltage based on the resistor R, the output of the comparator 21 is reversed. Thus, the switch controller 22 completes the period T3a and performs the control of the next period T3b. Moreover, in the period T3a, the switch S2 is turned on and the capacitor C2 is discharged. Thus, in time period T3a, the switch circuit is configured to respectively connect INB and INC to C1 and R and respectively to N2 and N1, while S2 discharges C2.

Figures 11, 12:
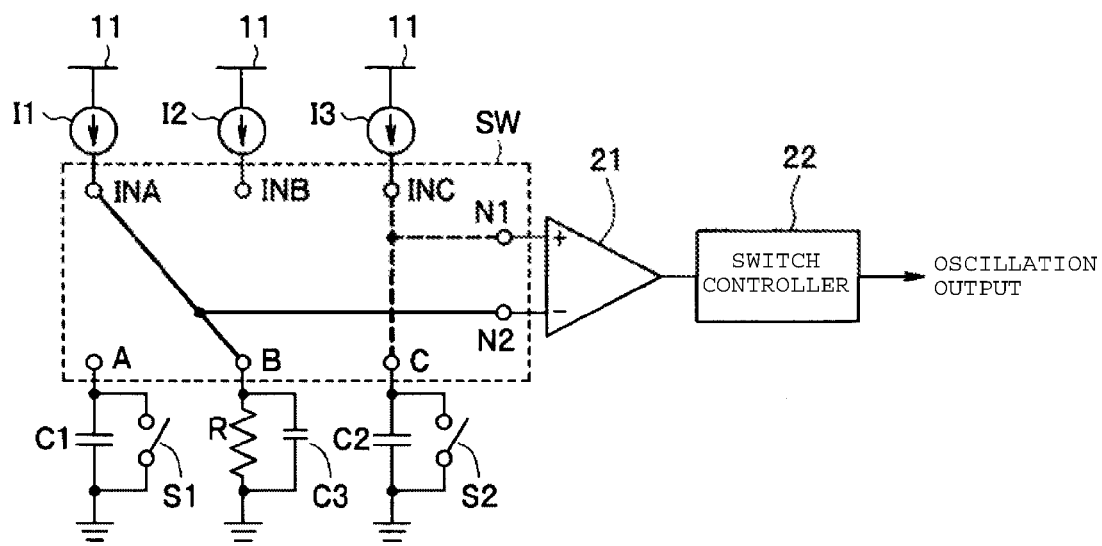
FIG. 12 illustrates control of constant current supply to the terminals using a switch circuit employed in an oscillator according to a second embodiment.

In the period T3b, as illustrated in FIGS. 5 and 11, the switch controller 22 allows the terminal INA to be connected to the terminal B and the terminal N2, and the terminal INC to be connected to the terminal C and the terminal N1. For example, if the switch circuit SW is configured with the circuit of FIG. 3, the switch controller 22 allows the switches a of the switch groups Sb and Sn2, and the switches c of the switch groups Sc and Sn1 to be turned on, and all switches a to c of the switch group Sa to be turned off. That is, the current does not flow from the current source I2 in the period T3b. The terminal voltage of the capacitor C2 is accordingly increased and if the terminal voltage of the capacitor C2 exceeds the reference voltage based on the resistor R, the output of the comparator 21 is reversed. Thus, the switch controller 22 completes the period T3b and performs the control of the next period T1a. Moreover, in the period T3b, the switch S1 is turned on and the capacitor C1 is discharged. Thus, in time period T3b, the switch circuit is configured to respectively connect INA and INC to R and C2 and respectively to N2 and N1, while S1 discharges C1. Thereafter, the operations of the periods T1a to T3b are repeated.

As described above, also in the embodiment, for example, the capacitance values of the capacitors C1 and C2 are the same, and the currents I1 to I3 of the current sources I1 to I3 to be the same, and thereby it is possible to obtain the oscillation output of the constant cycle from the output terminal of the comparator 21 or the switch controller 22. In addition, the reference voltage is alternately applied to the positive-phase input terminal and the reverse-phase input terminal of the comparator 21 every half cycle of the oscillation output based on the resistor R, and the influence of the offset of the comparator 21 is avoid. Thus, it is possible to obtain the stable oscillation output irrespective of the variation of the element.

Then, in the embodiment, the current sources I1 to I3 are not continuously used and intermittently generate the current. For example, in the example of FIG. 5, the current sources I1 to I3 are not used every 3rd half cycle of the oscillation output. The flicker noise may have a tendency that variation thereof is irregular and is accordingly increased relatively often with a lapse of time. In the embodiment, occurrence of the flicker noise is initialized every 3rd half cycle of the oscillation output and it is possible to reduce the occurrence of the flicker noise in the current sources I1 to I3.

As described above, in the embodiment, since the current source that is a factor that determines the oscillation frequency of the oscillator is intermittently used, it is possible to suppress the occurrence of the flicker noise in the current source and to obtain a stable oscillation output frequency.

Second Embodiment

FIG. 12 is an explanatory view describing control of a switch circuit SW in a second embodiment. A hardware configuration in the embodiment is the same as that of the first embodiment. FIG. 12 illustrates how a constant current is supplied to which terminal by the switch circuit SW by the same method as that described in FIG. 5. Moreover, FIG. 12 illustrates control of each switch group in a case where the circuit of FIG. 4 is employed as the switch circuit SW, but the same control can be performed even if the circuit of FIG. 3 is used. Thus, description of the control using the circuit of FIG. 3 is omitted.

In the first embodiment, an example is described, in which the reference voltage generated by the resistor R is alternately applied to the positive-phase input terminal and the reverse-phase input terminal of the comparator 21 every half cycle of the oscillation output. On the other hand, in the second embodiment, the reference voltage is applied to only the positive-phase input terminal or only the reverse-phase input terminal. For example, it can be realized by performing the control different from the control of the first embodiment for the switch groups Sn1 and Sn2 of the switch circuit SW of FIG. 3 or 4.

In the example of FIG. 12, a connection relationship between terminals INA to INC and terminals A to C of the switch circuit SW in each of periods T1a to T3b is the same as that of the example of FIG. 5. The example of FIG. 12 is different from FIG. 5 only in that a terminal B to which the resistor R applying the reference voltage is connected is always connected to a terminal N1. Other controls in a switch controller 22 is the same as those of the first embodiment.

An operation of the embodiment having such a configuration is described with reference to FIGS. 12 to 18. FIGS. 13 to 18 are circuit diagrams illustrating wiring states in each period of FIG. 12 and illustrate connection states by using the same method as that described in FIGS. 6 to 11.

Figure 13:
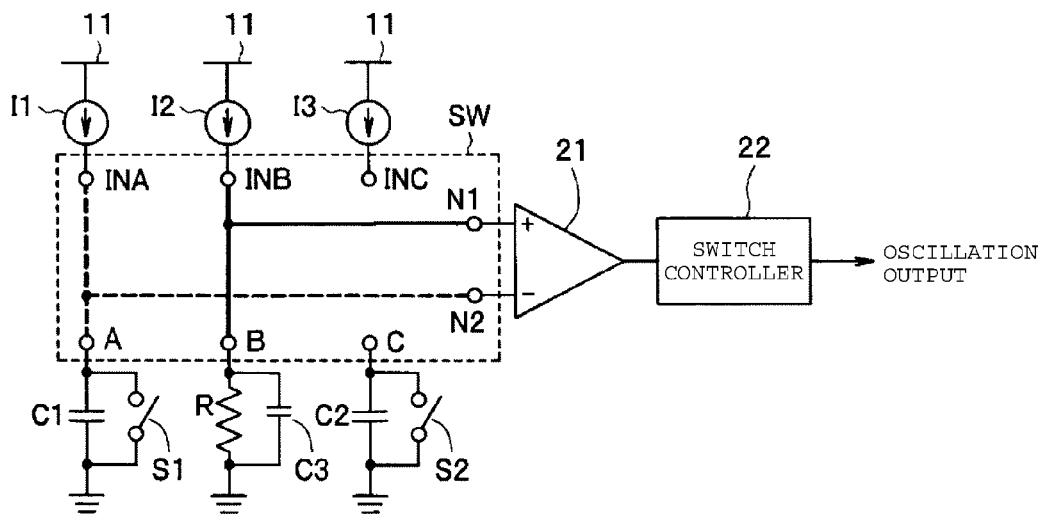
FIGS. 13-18 are each a circuit diagram illustrating a different wiring state of the oscillator according to the second embodiment.

In an initial period T1a, as illustrated in FIGS. 12 and 13, the switch controller 22 allows the terminal INA to be connected to the terminal A and the terminal N2, and the terminal INB to be connected to the terminal B and the terminal N1. For example, if the switch circuit SW is configured with the circuit of FIG. 4, the switch controller 22 allows the switches a of the switch groups Sa and Sn2, and the switches b of the switch groups Sb and Sn1 to be turned on, and all switches a to c of the switch group Sc to be turned off. That is, the current does not flow from the current source I3 in the period T1a. The terminal voltage of the capacitor C1 is accordingly increased and if the terminal voltage of the capacitor C1 exceeds the reference voltage based on the resistor R, the output of the comparator 21 is reversed. Thus, the switch controller 22 completes the period T1a and performs the control of the next period T1b. Moreover, in the period T1a, the switch S2 is turned on and the capacitor C2 is discharged. Thus, during time period T1a, the switch circuit is configured to respectively connect INA and INB to C1 and R and respectively to N2 and N1, while S2 discharges C2.

Figure 14:
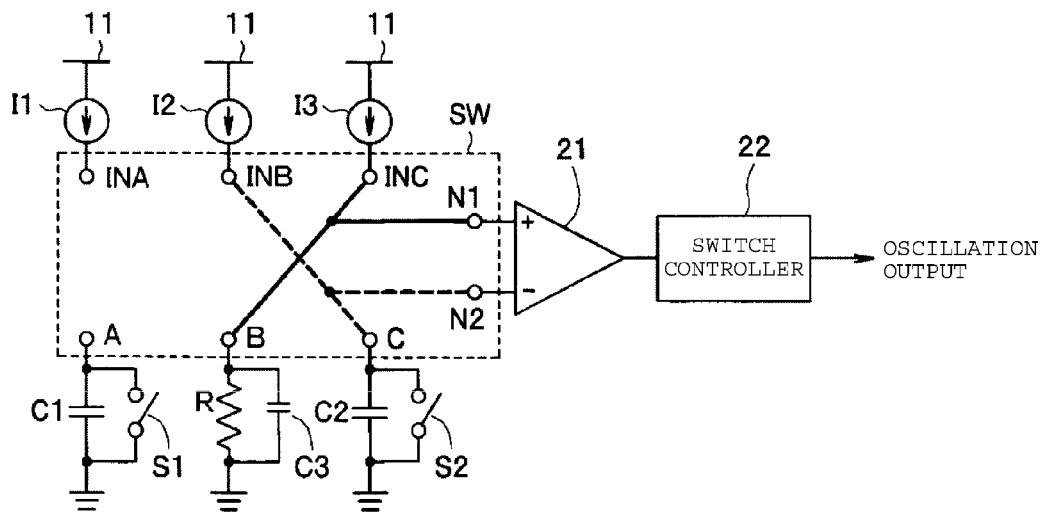

In the period T1b, as illustrated in FIGS. 12 and 14, the switch controller 22 allows the terminal INB to be connected to the terminal C and the terminal N2, and the terminal INC to be connected to the terminal B and the terminal N1. For example, if the switch circuit SW is configured with the circuit of FIG. 4, the switch controller 22 allows the switches c of the switch groups Sb and Sn2, and the switches b of the switch groups Sc and Sn1 to be turned on, and all switches a to c of the switch group Sa to be turned off. That is, the current does not flow from the current source I1 in the period T1b. The terminal voltage of the capacitor C2 is accordingly increased and if the terminal voltage of the capacitor C2 exceeds the reference voltage based on the resistor R, the output of the comparator 21 is reversed. Thus, the switch controller 22 completes the period T1b and performs the control of the next period T2a. Moreover, in the period T1b, the switch S1 is turned on and the capacitor C1 is discharged. Thus, during time period T1b, the switch circuit is configured to respectively connect INC and INB to R and C2 and respectively N1 and N2, while S1 discharges C1.

Figure 15:
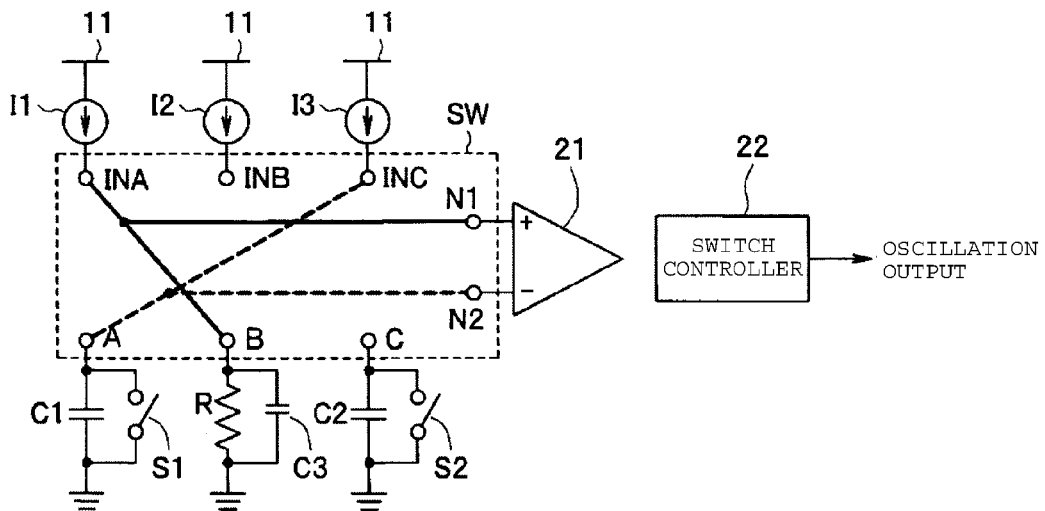

In an initial period T2a, as illustrated in FIGS. 12 and 15, the switch controller 22 allows the terminal INA to be connected to the terminal B and the terminal N1, and the terminal INC to be connected to the terminal A and the terminal N2. For example, if the switch circuit SW is configured with the circuit of FIG. 4, the switch controller 22 allows the switch c of the switch group Sa, the switches a of the switch groups Sb and Sn2, and the switches b of the switch group Sn1 to be turned on, and all switches a to c of the switch group Sc to be turned off. That is, the current does not flow from the current source I2 in the period T2a. The terminal voltage of the capacitor C1 is accordingly increased and if the terminal voltage of the capacitor C1 exceeds the reference voltage based on the resistor R, the output of the comparator 21 is reversed. Thus, the switch controller 22 completes the period T2a and performs the control of the next period T2b. Moreover, in the period T2a, the switch S2 is turned on and the capacitor C2 is discharged. Thus, during time period T2a, the switch circuit is configured to respectively connect INC and INA to C1 and R and respectively to N2 and N1, while S2 discharges C2.

Figure 16:
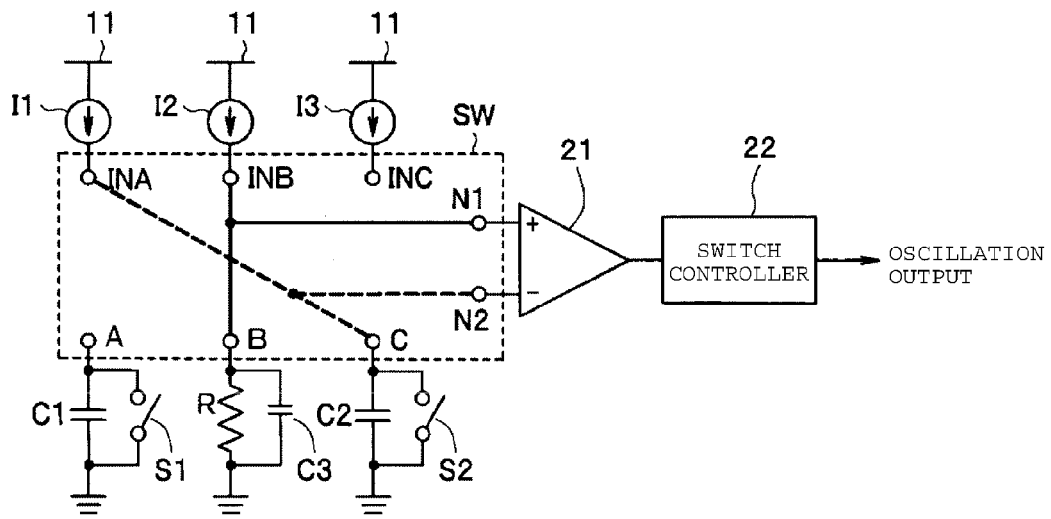

In the period T2b, as illustrated in FIGS. 12 and 16, the switch controller 22 allows the terminal INA to be connected to the terminal C and the terminal N2, and the terminal INB to be connected to the terminal B and the terminal N1. For example, if the switch circuit SW is configured with the circuit of FIG. 4, the switch controller 22 allows the switches b of the switch groups Sb and Sn1, the switch a of the switch group Sc, and the switch c of the switch group Sn2 to be turned on, and all switches a to c of the switch group Sa to be turned off. That is, the current does not flow from the current source I3 in the period T2b. The terminal voltage of the capacitor C2 is accordingly increased and if the terminal voltage of the capacitor C2 exceeds the reference voltage based on the resistor R, the output of the comparator 21 is reversed. Thus, the switch controller 22 completes the period T2b and performs the control of the next period T3a. Moreover, in the period T2b, the switch S1 is turned on and the capacitor C1 is discharged. Thus, during time period T2b, the switch circuit is configured to respectively connect INB and INA to R and C2 and respectively to N1 and N2 while S1 discharges C1.

Figure 17:
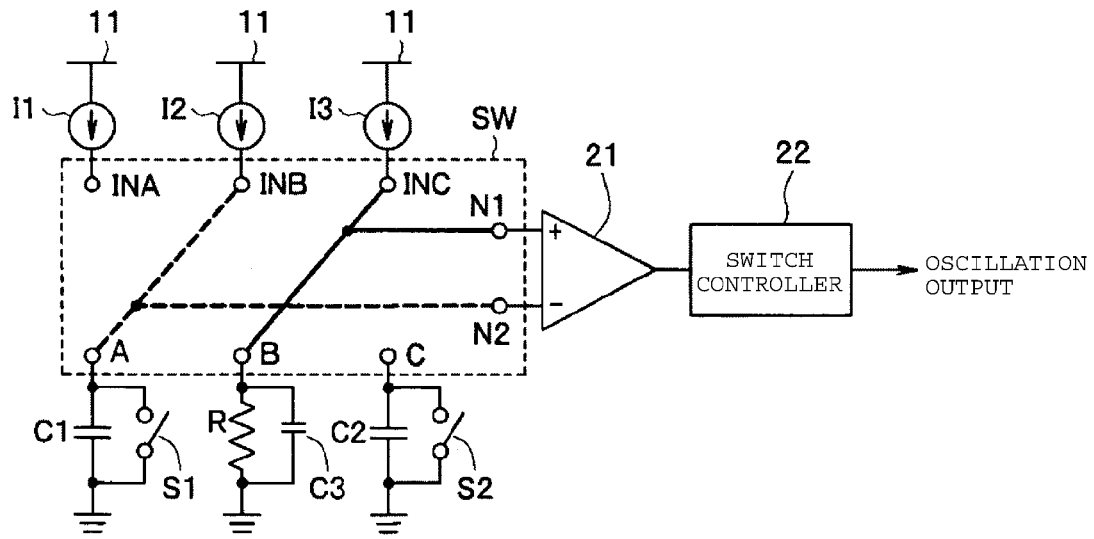

In the period T3a, as illustrated in FIGS. 12 and 17, the switch controller 22 allows the terminal INB to be connected to the terminal A and the terminal N2, and the terminal INC to be connected to the terminal B and the terminal N1. For example, if the switch circuit SW is configured with the circuit of FIG. 4, the switch controller 22 allows the switches b of the switch groups Sa and Sn1, the switch c of the switch group Sb, and the switch a of the switch group Sn2 to be turned on, and all switches a to c of the switch group Sc to be turned off. That is, the current does not flow from the current source I1 in the period T3a. The terminal voltage of the capacitor C1 is accordingly increased and if the terminal voltage of the capacitor C1 exceeds the reference voltage based on the resistor R, the output of the comparator 21 is reversed. Thus, the switch controller 22 completes the period T3a and performs the control of the next period T3b. Moreover, in the period T3a, the switch S2 is turned on and the capacitor C2 is discharged. Thus, during time period T3a, the switch circuit is configured to respectively connect INB and INC to C1 and R and respectively to N2 and N1, while S2 discharges C2.

Figure 18:
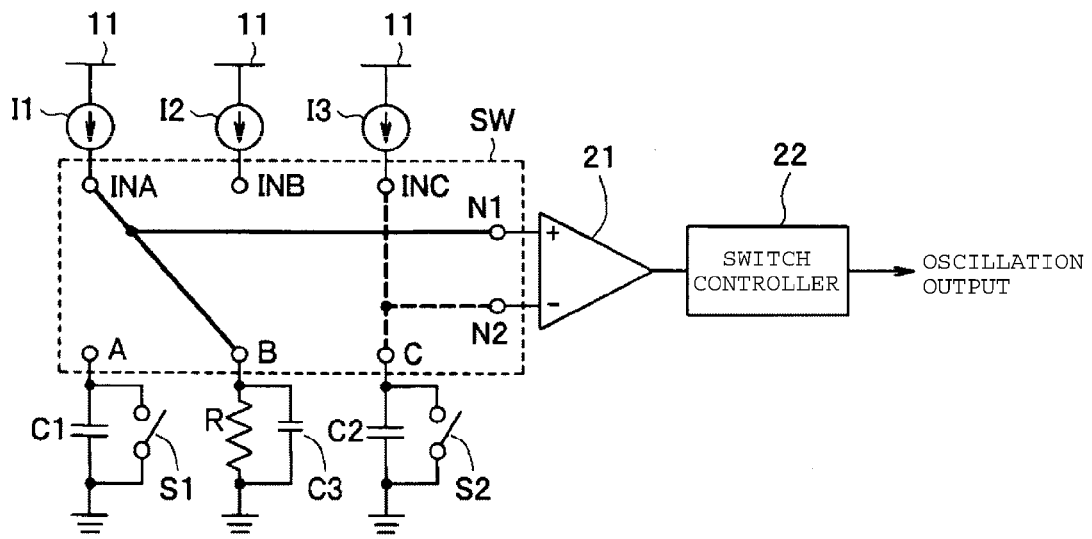

In the period T3b, as illustrated in FIGS. 12 and 18, the switch controller 22 allows the terminal INA to be connected to the terminal B and the terminal N1, and the terminal INC to be connected to the terminal C and the terminal N2. For example, if the switch circuit SW is configured with the circuit of FIG. 4, the switch controller 22 allows the switches a of the switch group Sb, the switches c of the switch groups Sc and Sn2, and the switch b of the switch group Sn1 to be turned on, and all switches a to c of the switch group Sa to be turned off. That is, the current does not flow from the current source I2 in the period T3b. The terminal voltage of the capacitor C2 is accordingly increased and if the terminal voltage of the capacitor C2 exceeds the reference voltage based on the resistor R, the output of the comparator 21 is reversed. Thus, the switch controller 22 completes the period T3b and performs the control of the next period T1a.

Moreover, in the period T3b, the switch S1 is turned on and the capacitor C1 is discharged. Thereafter, the operations of the periods T1a to T3b are repeated. Thus, the switch circuit is configured to respectively connect INA and INC to R and C2 and respectively to N1 and N2, while S1 discharges C1.

As described above, also in the embodiment, the current sources I1 to I3A intermittently generate the current without being continuously used. Thus, the variation of the current value of the current source is suppressed and the stable oscillation output is obtained by suppressing the occurrence of the flicker noise in the current source. Moreover, the embodiment is effective in a system in which it is not necessary to avoid the influence of the offset for each element of the comparator. Since the terminal to which the resistor R is connected may be always connected to one input terminal of the comparator, it is possible to simplify the configuration and the control of the switch circuit.

Third Embodiment

Figure 19:
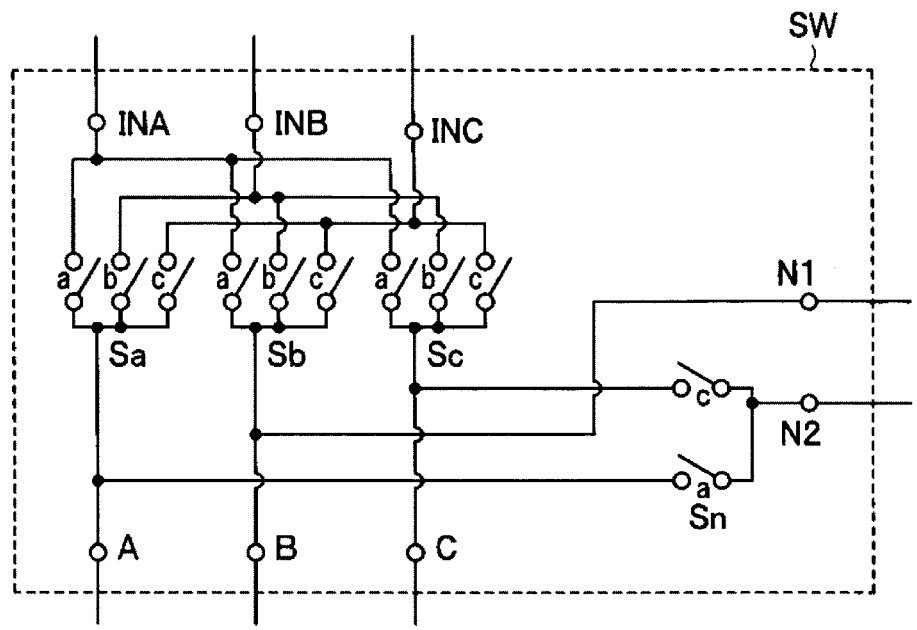
FIG. 19 is a circuit diagram illustrating an example of a specific configuration of a switch circuit employed in an oscillator according to a third embodiment.
Figure 20:
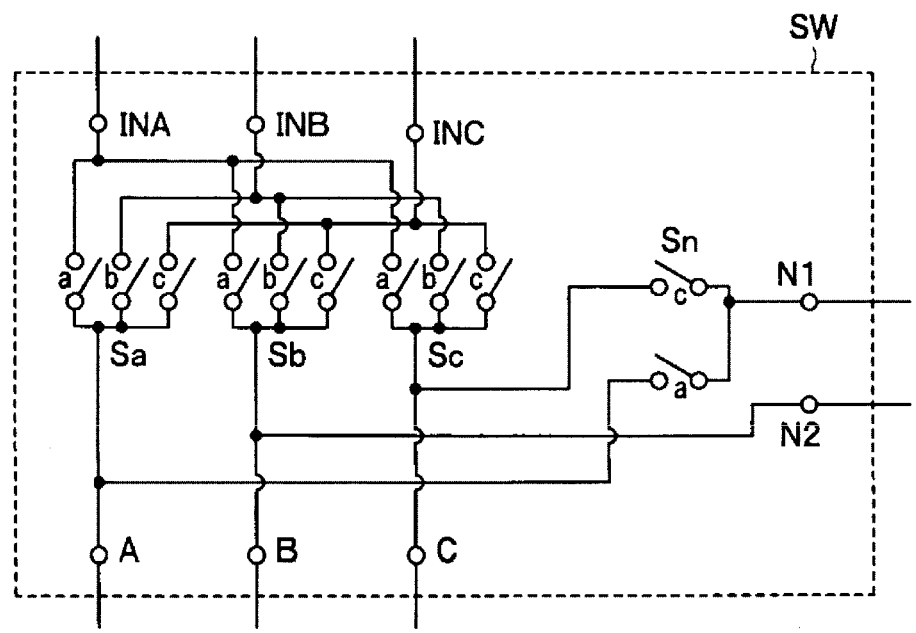
FIG. 20 is a circuit diagram illustrating another example of a specific configuration of the switch circuit employed in the oscillator according to the third embodiment.

FIGS. 19 and 20 are circuit diagrams illustrating examples of specific configurations of a switch circuit SW employed in a third embodiment of the invention.

In the second embodiment, the reference voltage is applied to only the positive-phase input terminal or the reverse-phase input terminal of the comparator 21. Thus, the switch circuit SW is configured such that only the terminal B connected to the resistor R may be connected to the positive-phase input terminal or the reverse-phase input terminal of the comparator 21. FIG. 19 illustrates an example in which a terminal B is connected to the positive-phase input terminal of the comparator 21 and FIG. 20 illustrates an example in which the terminal B is connected to the reverse-phase input terminal of the comparator 21.

The switch circuit SW includes three switch groups Sa, Sb, and Sc including three switches a, b, and c thus each switch group Sa-Sc implementing a single pole three throw (SP3T) switch, and a switch group Sn including two switches a and c, thus the Sn switch group implementing a single pole two-throw (SP2T) switch. In each of the switches a to c of the switch groups Sa, Sb, and Sc, one end (the pole) is commonly connected for each of the switch groups Sa to Sc and is connected to terminals A to C respectively. All the other ends of the switches a (a-throws) of the switch groups Sa to Sc are connected to a terminal INA and the other end of each switch b (b-throws) of the switch groups Sa to Sc is connected to the terminal INB, and all the other ends of each switch c (c-throws) of a switch groups Sa to Sc are connected to a terminal INC.

One end (the pole) of each of the switches a and c of the switch group Sn is commonly connected and is connected to a terminal N2. The other end of the switch a (a-throw) of the switch group Sn is connected to a terminal A and the other end of the switch c (c-throw) of the switch group Sn is connected to a terminal C. The terminal B is connected to the terminal N1. Thus, the reference voltage appearing in the terminal B is supplied to the positive-phase input terminal of the comparator 21 via the terminal N1.

In FIG. 20, the configuration of three switch groups Sa, Sb, and Sc of the switch circuit SW is the same as that of FIG. 19. One end of each (pole) of the switches a and c of the switch group Sn including two switches a and c is commonly connected and is connected to the terminal N1. The other end of the switch a (a-throw) of the switch group Sn is connected to the terminal A and the other end (c-throw) of the switch c of the switch group Sn is connected to the terminal C. The terminal B is connected to the terminal N2.

Thus, the reference voltage appearing in the terminal B is supplied to the reverse-phase input terminal of the comparator 21 via the terminal N2.

Also in the embodiment having such a configuration, the same control as that of the second embodiment may be performed. For example, if the circuit of FIG. 19 is employed, in FIG. 12, the control of the switch group Sn1 is omitted and the same control as the control of the switch group Sn2 may be performed with respect to the switch group Sn of FIG. 19. Thus, the same control as that illustrated in FIGS. 12 to 18 is performed. In addition, even if the control of the switch group Sn1 of FIG. 12 is omitted and the same control as the control of the switch group Sn2 is performed with respect to the switch group Sn of FIG. 20, the same control as that of FIG. 12 is performed except that the polarity of the oscillation output is reversed.

In the embodiment described above, there is an advantage that the same effects as those of the second embodiment are obtained, the switch circuit is simplified more than the second embodiment, and the control can more easily be performed.

Moreover, in each of the above-described embodiments, an example is illustrated, in which the same control is performed every six periods, that is, every half cycle of the three cycles of the oscillation output, but the control may be performed in any cycle as long as the current source is configured to be intermittently used. For example, in the example of FIG. 5, the current source is not used every three periods, while the control is performed such that the reference voltage is alternately supplied to the positive-phase input terminal and the reverse-phase input terminal of the comparator in view of the offset. Thus, the same control is performed every six half cycles. From the viewpoint of the offset, it is necessary to perform the same control every even-numbered cycle, and from the viewpoint of evenly using the three current sources, since each current source is not used every three periods, the same control may be performed every three half cycles. For example, in the case where the number of the current sources is four, the same control may be performed every two half cycles, and if the offset is considered, the same control may be performed every eight half cycles.

In addition, in each of the above-described embodiments, an example, in which the number of resistor is one and the number of capacitors is two, is described. In order to change the oscillation frequency, a plurality of resistors having different resistance values may be prepared, the resistors may be used with being switched therebetween. Also, the three or more capacitors may be provided.

Moreover, the example embodiments are not limited to the embodiments and can be variously modified without departing from the spirit of the exemplary embodiments. In addition, the above-described embodiments include the exemplary embodiments of various stages and various exemplary embodiments can be extracted by appropriately combining a plurality of configuration elements that are disclosed. For example, even if any configuration element is removed from all the configuration components illustrated in the embodiments, it is possible to solve the problems described in the detailed description. If the effects described in the detailed description are obtained, the configuration in which the configuration components are removed may be extracted as the exemplary embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An oscillator comprising:
   first, second, and third current sources;
   a resistor having a first terminal, and a second terminal connected to a reference voltage;
   a first capacitor having a first terminal, and a second terminal connected to the reference voltage;
   a second capacitor having a first terminal, and a second terminal connected to the reference voltage;
   a switch circuit through which each of the current sources is connectable to the first terminal of one of the resistor and the two capacitors to supply current thereto;
   a comparator having a first input, a second input, and configured to generate an output signal by comparing voltage levels at the first input and the second input; and
   a switch controller configured to generate control signals for the switch circuit and an oscillation output signal for each of multiple periods based on the output signal from the comparator, wherein
   during a first period, which is one of the multiple periods, the switch circuit is controlled to connect the first current source to the first terminal of the first capacitor, the second current source to the first terminal of the resistor, the first terminal of the resistor to the first input of the comparator, and the first terminal of the first capacitor to the second input of the comparator.

2. The oscillator according to claim 1, wherein during the first period, the third current source is not connected to any one of the first terminals of the resistor and the first and second capacitors.

3. The oscillator according to claim 2, wherein
   during a second period, which is one of the multiple periods and directly follows the first period, the switch circuit is controlled to connect the second current source to the first terminal of the second capacitor, the third current source to the first terminal of the resistor, the first terminal of the second capacitor to the first input of the comparator, and the first terminal of the resistor to the second input of the comparator, and
   the first current source is not connected to any one of the first terminals of the resistor and the first and second capacitors.

4. The oscillator according to claim 3, wherein
   during a third period, which is one of the multiple periods and directly follows the second period, the switch circuit is controlled to connect the first current source to the first terminal of the resistor, the third current source to the first terminal of the first capacitor, the first terminal of the resistor to the first input of the comparator, and the first terminal of the first capacitor to the second input of the comparator, and
   the second current source is not connected to any one of the first terminals of the resistor and the first and second capacitors.

5. The oscillator according to claim 4, wherein
   during a fourth period, which is one of the multiple periods and directly follows the third period, the switch circuit is controlled to connect the first current source to the first terminal of the second capacitor, the second current source to the first terminal of the resistor, the first terminal of the second capacitor to the first input of the comparator, and the first terminal of the resistor to the second input of the comparator, the third current source is not connected to any one of the first terminals of the resistor and the first and second capacitors.

6. The oscillator according to claim 5, wherein during a fifth period, which is one of the multiple periods and directly follows the fourth period, the switch circuit is controlled to connect the second current source to the first terminal of the first capacitor, the third current source to the first terminal of the resistor, the first terminal of the resistor to the first input of the comparator, and the first terminal of the first capacitor to the second input of the comparator, and the first current source is not connected to any one of the first terminals of the resistor and the first and second capacitors.

7. The oscillator according to claim 6, wherein during a sixth period, which is one of the multiple periods and directly follows the fifth period, the switch circuit is controlled to connect the first current source to the first terminal of the resistor, the third current source to the first terminal of the second capacitor, the first terminal of the second capacitor to the first input of the comparator, and the first terminal of the resistor to the second input of the comparator, and the second current source is not connected to any one of the first terminals of the resistor and the first and second capacitors.

8. The oscillator according to claim 7, further comprising:

a first switch connected in parallel with the first capacitor between the first and second terminals of the first capacitor; and a second switch connected in parallel with the second capacitor between the first and second terminals of the second capacitor, wherein the first switch is open during the first, third, and fifth periods, and closed during the second, fourth, and sixth periods, and the second switch is open during the second, fourth, and sixth periods, and closed during the first, third, and fifth periods.

9. The oscillator according to claim 1, further comprising:

a first switch connected in parallel with the first capacitor between the first and second terminals of the first capacitor;

a second switch connected in parallel with the second capacitor between the first and second terminals of the second capacitor; and a third capacitor connected in parallel with the resistor between the first and second terminals of the resistor.

10. The oscillator according to claim 1, wherein switch controller outputs the output signal from the comparator as the oscillation output signal for each of the multiple periods.

11. An oscillator comprising:

first, second, and third current sources;

a resistor having a first terminal, and a second terminal connected to a reference voltage;

a first capacitor having a first terminal, and a second terminal connected to the reference voltage;

a second capacitor having a first terminal, and a second terminal connected to the reference voltage;

a comparator having a first input, a second input, and configured to generate an output signal by comparing voltage levels at the first input and the second input;

a switch circuit through which each of the current sources is connectable to the first terminal of one of the resistor and the two capacitors to supply current thereto and through which the first terminal of the resistor is connected to one of the first and second inputs of the comparator and the first terminal of one of the first and second capacitors is connected to the other one of the first and second inputs of the comparator; and a switch controller connected to the comparator to receive the output signal from the comparator and configured to control the switch circuit based on the output signal to connect two of the current sources to two of the first terminals of the resistor and the first and second capacitors and not connect the remaining one of the current sources to any one of the first terminals of the resistor and the first and second capacitors.

12. The oscillator according to claim 11, wherein the switch controller controls the switch circuit in the same manner for each repeating control cycle that spans three clock cycles, and differently for each half cycle within the three clock cycles of the control cycle.

13. The oscillator according to claim 12, wherein the remaining one of the current sources not connected to any one of the first terminals of the resistor and the first and second capacitors alternates among the three current sources each half cycle.

14. The oscillator according to claim 12, wherein the first terminal of the resistor is alternately connected to one of the first and second inputs of the comparator each half cycle.

15. The oscillator according to claim 12, further comprising:

a first switch connected in parallel with the first capacitor between the first and second terminals of the first capacitor; and a second switch connected in parallel with the second capacitor between the first and second terminals of the second capacitor, wherein the first switch alternates between open and closed for each half cycle and the second switch alternates between closed and open for each half cycle.

16. The oscillator according to claim 11, further comprising:

a first switch connected in parallel with the first capacitor between the first and second terminals of the first capacitor;

a second switch connected in parallel with the second capacitor between the first and second terminals of the second capacitor; and a third capacitor connected in parallel with the resistor between the first and second terminals of the resistor.

17. The oscillator according to claim 11, wherein the switch controller outputs the output signal from the comparator as an oscillation output signal.

18. A method of minimizing noise in an oscillator having first, second, and third current sources, a resistor having first and second terminals, first and second capacitors each having first and second terminals, a switch circuit, and a comparator, the method comprising:

controlling the switch circuit for each of multiple periods based on an output signal from the comparator, wherein during a first period, which is one of the multiple periods, the switch circuit is controlled to connect the first current source to the first terminal of the first capacitor, the second current source to the first terminal of the resistor, the first terminal of the resistor to a first input of the comparator, and the first terminal of the first capacitor to a second input of the comparator.

19. The method according to claim 18, wherein during the first period, the third current source is not connected to any one of the first terminals of the resistor and the first and second capacitors.

20. The method according to claim 18, further comprising:
   outputting the output signal of the comparator as an oscillation output signal of the oscillator.

\* \* \* \* \*